(12) United States Patent
Silvernail et al.

(10) Patent No.: US 8,766,517 B2
(45) Date of Patent: Jul. 1, 2014

(54) ORGANIC LIGHT EMITTING DEVICE WITH CONDUCTING COVER

(75) Inventors: Jeffrey Silvernail, Yardley, PA (US); Jason Paynter, Bristol, PA (US); Kamala Rajan, Newtown, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 13/575,837

(22) PCT Filed: Feb. 3, 2010

(86) PCT No.: PCT/US2010/023056
§ 371 (c)(1),
(2), (4) Date: Sep. 5, 2012

(87) PCT Pub. No.: WO2011/096923
PCT Pub. Date: Aug. 11, 2011

(65) Prior Publication Data
US 2012/0319553 A1    Dec. 20, 2012

(51) Int. Cl.
*H01J 1/62* (2006.01)
*H01J 63/04* (2006.01)
*H01J 1/02* (2006.01)

(52) U.S. Cl.
USPC ............ 313/46; 313/483; 313/500; 313/501; 313/502; 313/503; 313/504; 313/505; 313/506; 313/510; 313/511; 313/512; 313/11

(58) Field of Classification Search
None
See application file for complete search history.

(56) References Cited

U.S. PATENT DOCUMENTS

| | | |
|---|---|---|
| 5,247,190 A | 9/1993 | Friend et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,867,539 B1 | 3/2005 | McCormick et al. |
| 7,132,801 B2 | 11/2006 | Park et al. |
| 7,173,369 B2 | 2/2007 | Forrest et al. |
| 7,205,717 B2 | 4/2007 | Cok |
| 7,279,704 B2 | 10/2007 | Walters et al. |
| 7,417,372 B2 | 8/2008 | Maeda et al. |
| 7,431,968 B1 | 10/2008 | Shtein et al. |
| 2005/0184662 A1 | 8/2005 | Cok et al. |
| 2008/0067921 A1 | 3/2008 | D'Andrade et al. |
| 2008/0265759 A1* | 10/2008 | Young et al. ................. 313/504 |
| 2009/0111206 A1 | 4/2009 | Luch |

OTHER PUBLICATIONS

The International Search Report issued in PCT/US2010/023056 application.

* cited by examiner

*Primary Examiner* — Natalie Walford
(74) *Attorney, Agent, or Firm* — Sterne, Kessler, Goldstein & Fox, P.L.L.C.

(57) ABSTRACT

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

18 Claims, 10 Drawing Sheets

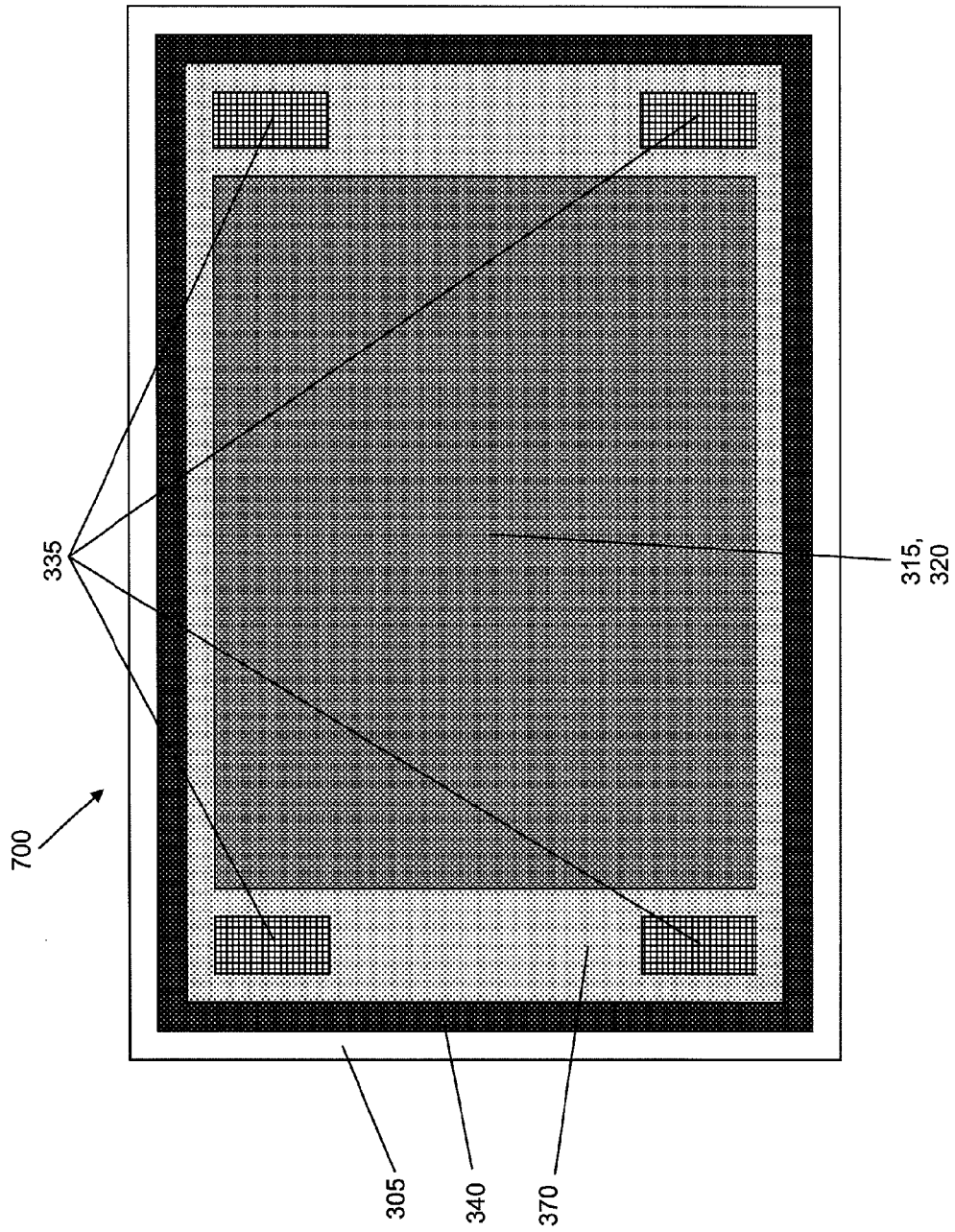

ORGANIC LIGHT EMITTING DEVICE WITH CONDUCTING COVER

GOVERNMENT RIGHTS

This invention was made with Government support under Contract No. DE-FC26-08NT01585 awarded by the Department of Energy. The government has certain rights in this invention.

RELATED APPLICATIONS

This application is a national stage application of, and claims priority to, International Application No. PCT/US2010/023056, filed Feb. 3, 2010, the disclosure of which is hereby expressly incorporated herein by reference in its entirety.

FIELD OF INVENTION

The present application relates to organic light-emitting devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays; illumination, including lighting panels; and backlighting. Several OLED materials and configurations are described in U.S. Pat. Nos. 5,844,363, 6,303,238, and 5,707,745, which are incorporated herein by reference in their entirety.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction.

More details on OLEDs, and the definitions described above, may be found in U.S. Pat. No. 7,279,704, which is incorporated herein by reference in its entirety.

For some applications of OLEDs, such as elements of lighting panels, it may be desirable that the light emitted by the OLED be highly uniform in both intensity and in color spectrum across an emitting surface of the device. The larger the area of the emitting surface the more difficult it may be to achieve this desired uniformity. One cause of non-uniform emission may be variations in electrical potential across a face of a device from which light is emitted. These variations in electrical potential may be a result of insufficient electrical conductivity of an electrode. Achieving a more uniform potential across the face may result in a greater uniformity of light emission across the face.

SUMMARY

An organic light emitting device (OLED) configured to emit light uniformly over an emitting area and a method of making the OLED are disclosed. The OLED contains a substrate; an electrode disposed over the substrate; and a light-emitting structure containing an organic material. The light-emitting structure is in contact with the electrode. The OLED contains an electrically conductive cover substantially overlaying the electrode and an electrically conductive connecting material disposed between the electrically conductive cover and the electrode. The electrically conductive material provides an electrically conductive path connecting the electrically conductive cover and the electrode. The electrically conductive cover increases the overall uniformity of emitted light from the OLED.

BRIEF DESCRIPTION OF THE DRAWINGS

FIGS. 7A and 7B show a fifth embodiment of an OLED with a conducting cover.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Figure 1:
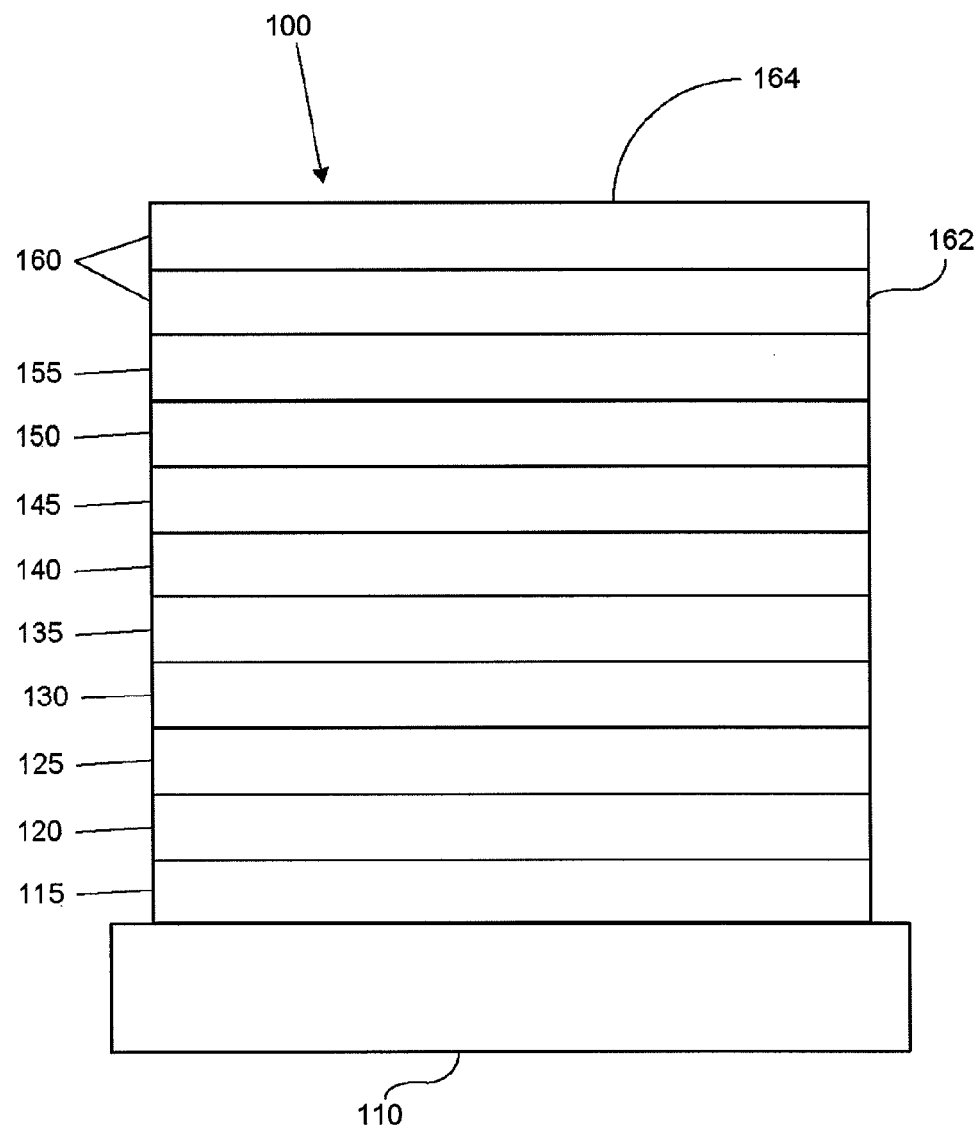
FIG. 1 shows an organic light emitting device.

FIG. 1 shows an organic light emitting device 100. The figures are not necessarily drawn to scale. Device 100 may include a substrate 110, an anode 115, a hole injection layer (HIL) 120, a hole transport layer (HTL) 125, an electron blocking layer (EBL) 130, an emissive layer (EML) 135, a hole blocking layer (HBL) 140, an electron transport layer (ETL) 145, an electron injection layer (EIL) 150, a protective layer 155, and a cathode 160. Cathode 160 may be a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference herein.

Figure 2:
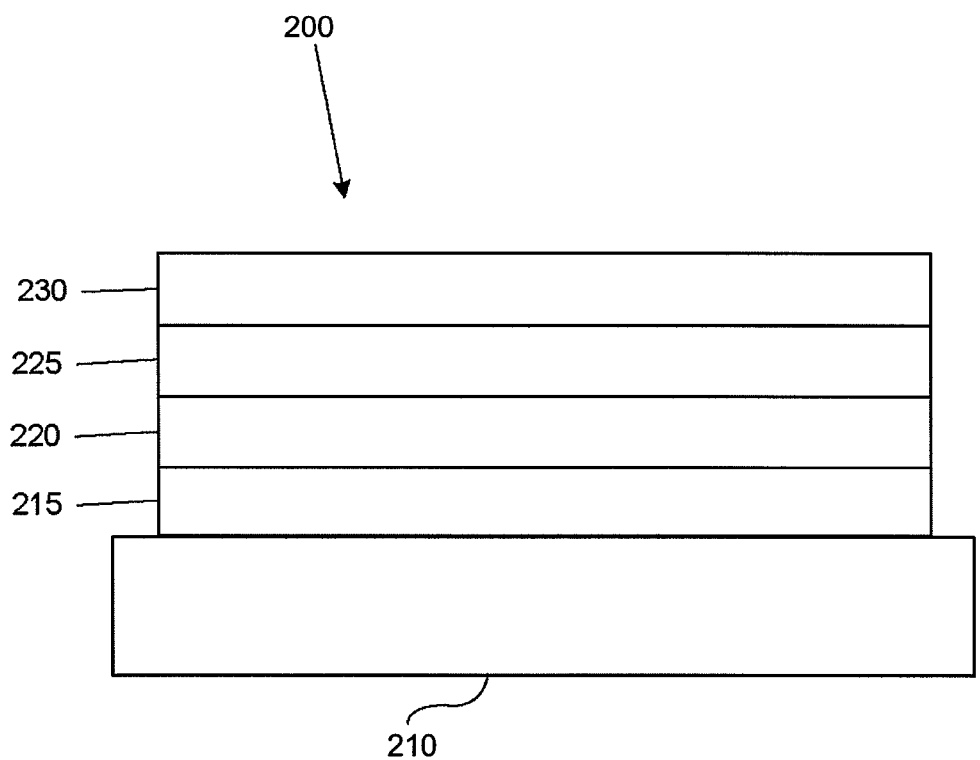
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

One problem with making large area OLED lighting panels is the uniformity of the emitting light. The non-uniformity of the light may be a result of poor electrical conductivity of one or more of the electrodes. In bottom-emission devices, the anode may be a thin film of transparent conductive oxide (TCO), whereas in top-emission devices, the cathode may be a transparent metal film. Throughout this description, "transparent" means essentially transparent at least to wavelengths emitted by a light emitting structure of an OLED, such as 315 in FIGS. 3-7, described below. The conductivity of electrode films varies with material types and thicknesses, with transparency of the film being inversely proportional to the conductivity. To improve the conductivity of the electrodes across the display, one solution is to use high conductivity buss lines. FIG. 8 shows a top view of an example of OLED 800. Electrical power is provided to various sections of the OLED using electrically conductive buss lines 805.

To achieve sufficient conductivity in buss lines 805 for uniform emission, buss lines 805 must be relatively thick, approximately 1 um, and must be relatively wide, several millimeters. There are two main issues with this approach: defect generation caused by buss line fabrication process and reduced active area (aperture ratio). Buss lines 805 are often patterned using a lift-off process. When very thick materials are used, the lift-off process becomes very long and the material may end up with sharp peaks along edges, causing the device to short. Furthermore, to maximize the light output, the effective emitting area must be maximized. If buss lines 805 are significantly wide, however, the effective emitting area may be reduced by the area of the buss lines. In that case, the OLED device may have to be driven harder to achieve a desired light output, and this may reduce the operational lifetime of the OLED.

Figure 3:
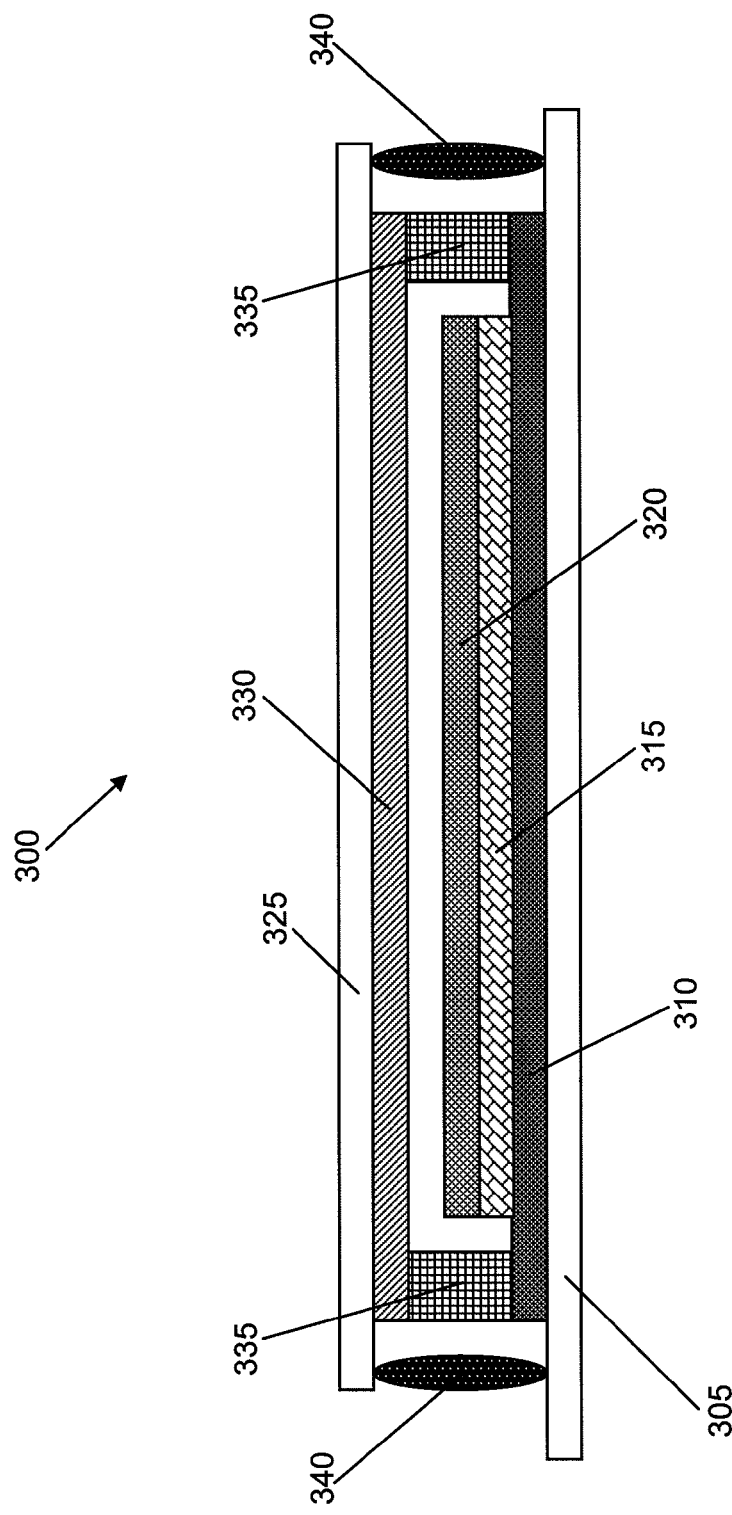
FIG. 3 shows an embodiment of an OLED with a conducting cover.

To reduce the size of buss lines 805, a conducting cover for encapsulating the OLED device may be used to distribute power to electrodes. FIG. 3 shows a side view (vertical cross section) of an embodiment of an OLED 300 configured to emit light uniform in intensity and color spectrum over an emitting area. OLED 300 contains an electrically conductive cover 330, described in detail below.

OLED 300 contains an electrode 310 disposed over a substrate 305. Electrode 310 is in contact with a light-emitting structure 315 that contains at least one organic material. Light-emitting structure 315 may be as described above, but is not limited to those as described above. A second electrode 320 is also in contact with light-emitting structure 315. Both electrode 310 and second electrode 320 are connected to an external source of electrical power (not shown) for generating power needed to obtain light emitted by light-emitting structure 315.

OLED 300 includes an electrically conductive cover 330 substantially overlaying electrode 310. Electrically conductive cover 330 may be attached to a cover 325 made of an electrically non-conductive material, such as glass, but this is not necessary, as described below. In the embodiment of FIG. 3, light-emitting structure 315 is encapsulated by substrate 305, cover 325, and an adhesive 340 forming a seal between substrate 305 and cover 325. Electrically conductive cover 330 may be a thin film of electrically conductive material, such as a metal, bonded to cover 325. Such a thin film may be deposited directly onto cover 325. Alternatively, a relatively thick conducting film may be screen-printed onto cover 325. In another alternative, a conducting foil could be bonded to cover 325. Other methods and materials may be used by a person of ordinary skill in the art while not departing from the scope of the attached claims, and the specific examples described here are not to be construed as limiting.

An electrically conductive material 335 is disposed between electrically conducting cover 330 and electrode 310 and provides an electrically conductive path connecting electrically conductive cover 330 and electrode 310. Electrically conductive material 335 may contain a conductive adhesive, a conductive elastomer, a conductive polymer, a conductive epoxy, or other similar materials known to a person of ordinary skill in the art, alone or in any combination. Electrically conductive material 335 may be a mechanical connector, such as wire or a spring.

The presence of electrically conductive cover 330 may be shown to enhance spatial uniformity of intensity and color spectrum of emitted light, compared with similar structures lacking electrically conductive cover 330 or an equivalent component. Including electrically conductive cover 330 effectively increases electrical conductivity of electrode 310, thus increasing uniformity of emitted light without significant loss of emitting area or fill factor, as addressed above in the description of with FIG. 8.

Figure 4A:
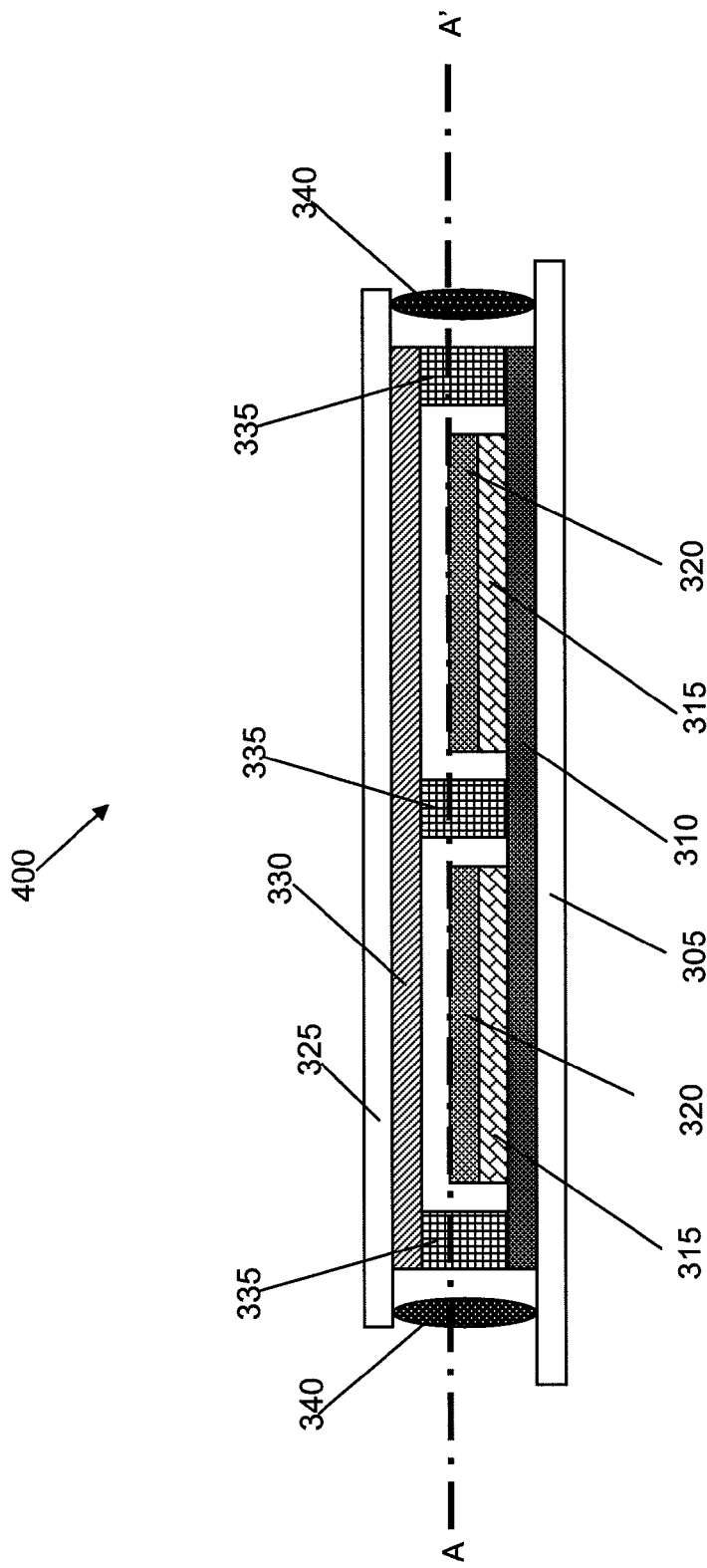
FIGS. 4A and 4B show a second embodiment of an OLED with a conducting cover.
Figure 4B:
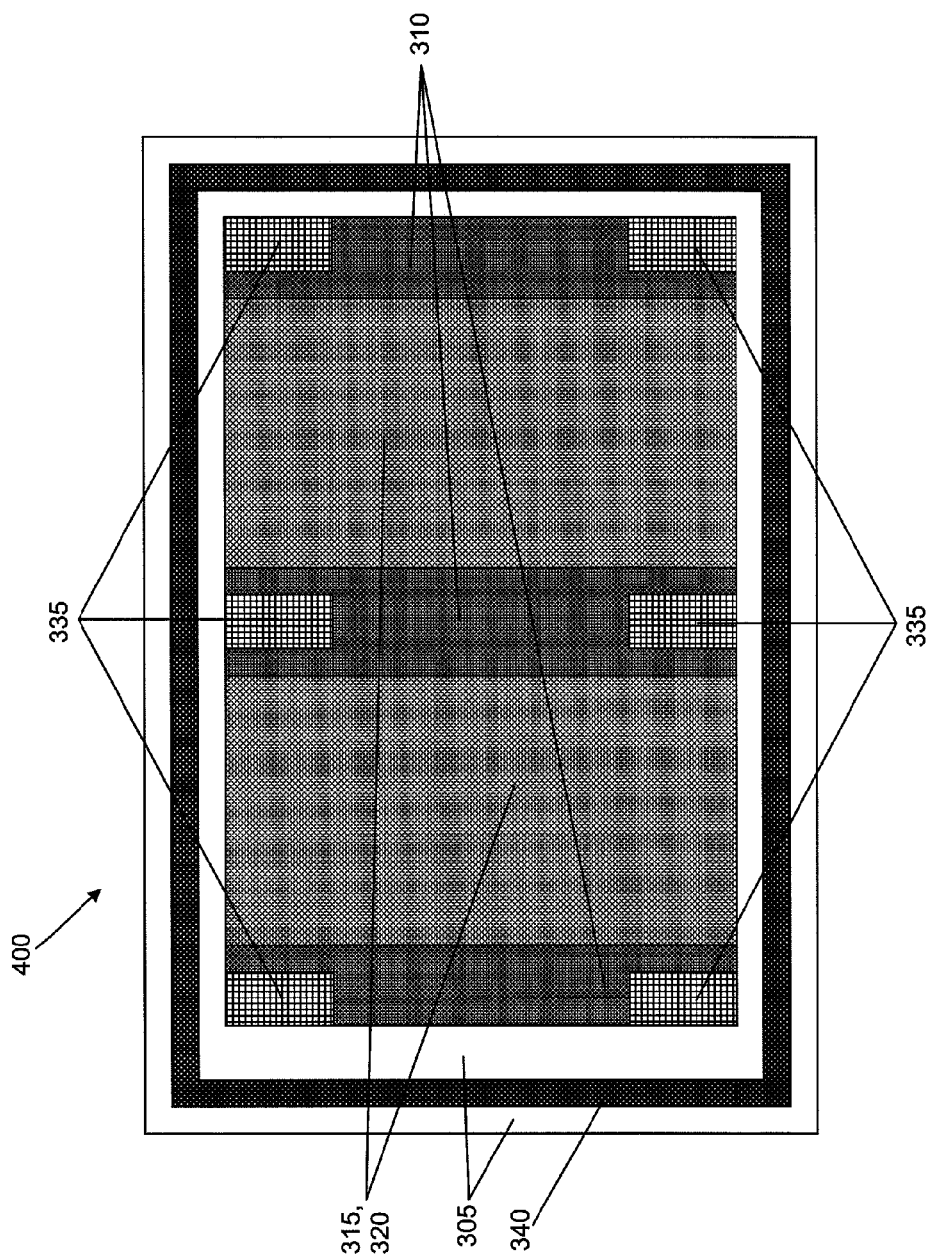

FIGS. 4A and 4B show side view and top view, respectively, of an OLED embodiment 400 with multiple connections between electrode 310 and electrically conductive cover 330. The top view of FIG. 4B is a downward view from the cut line A-A' in FIG. 4A. The multiple connections are provided by electrically conductive material 335. Uniformity of the emitted light may be further enhanced by such multiple connections.

Figure 5:
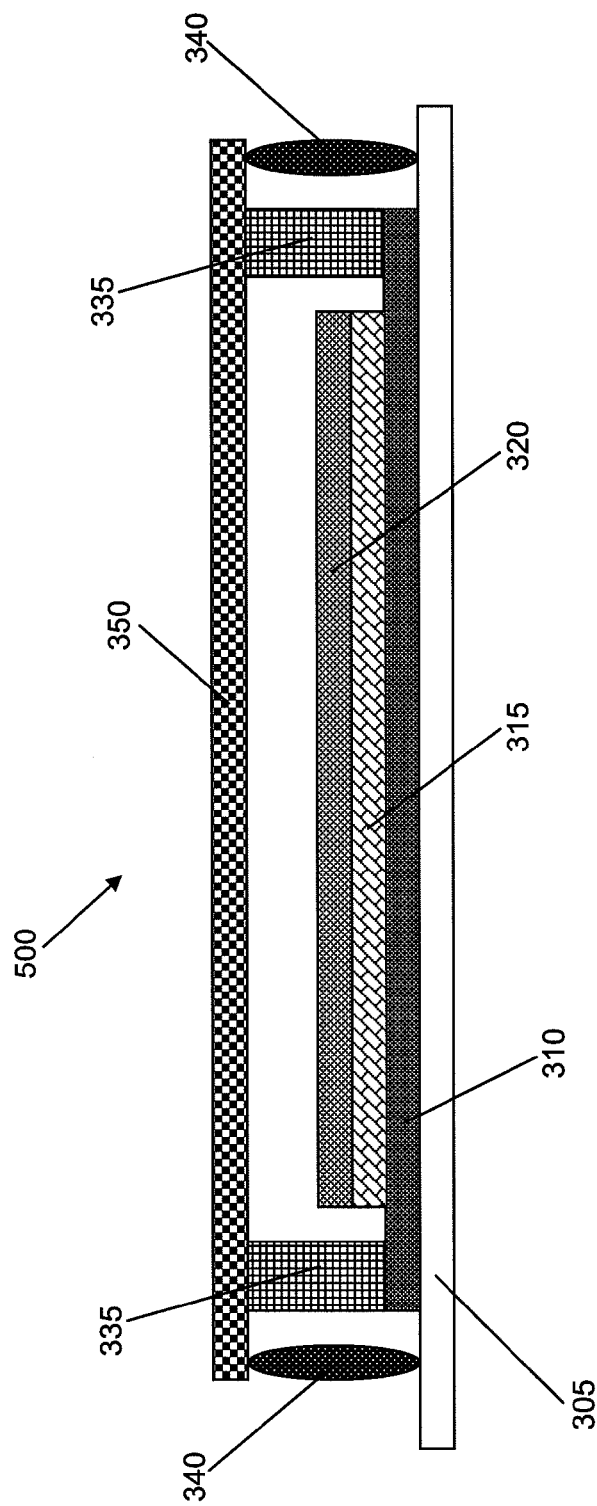
FIG. 5 shows a third embodiment of an OLED with a conducting cover.

FIG. 5 shows an OLED embodiment 500 having an electrically conductive cover 350 which may be a sheet of conducting material, such as aluminum, stainless steel, another metal, or any combination of these. Electrically conductive cover 350 may be of sufficient thickness to be self supporting. In the embodiment of FIG. 5, light-emitting structure 315 is encapsulated by substrate 305, electrically conductive cover 350, and adhesive 340 forming a seal between substrate 305 and electrically conductive cover 350.

Figure 6:
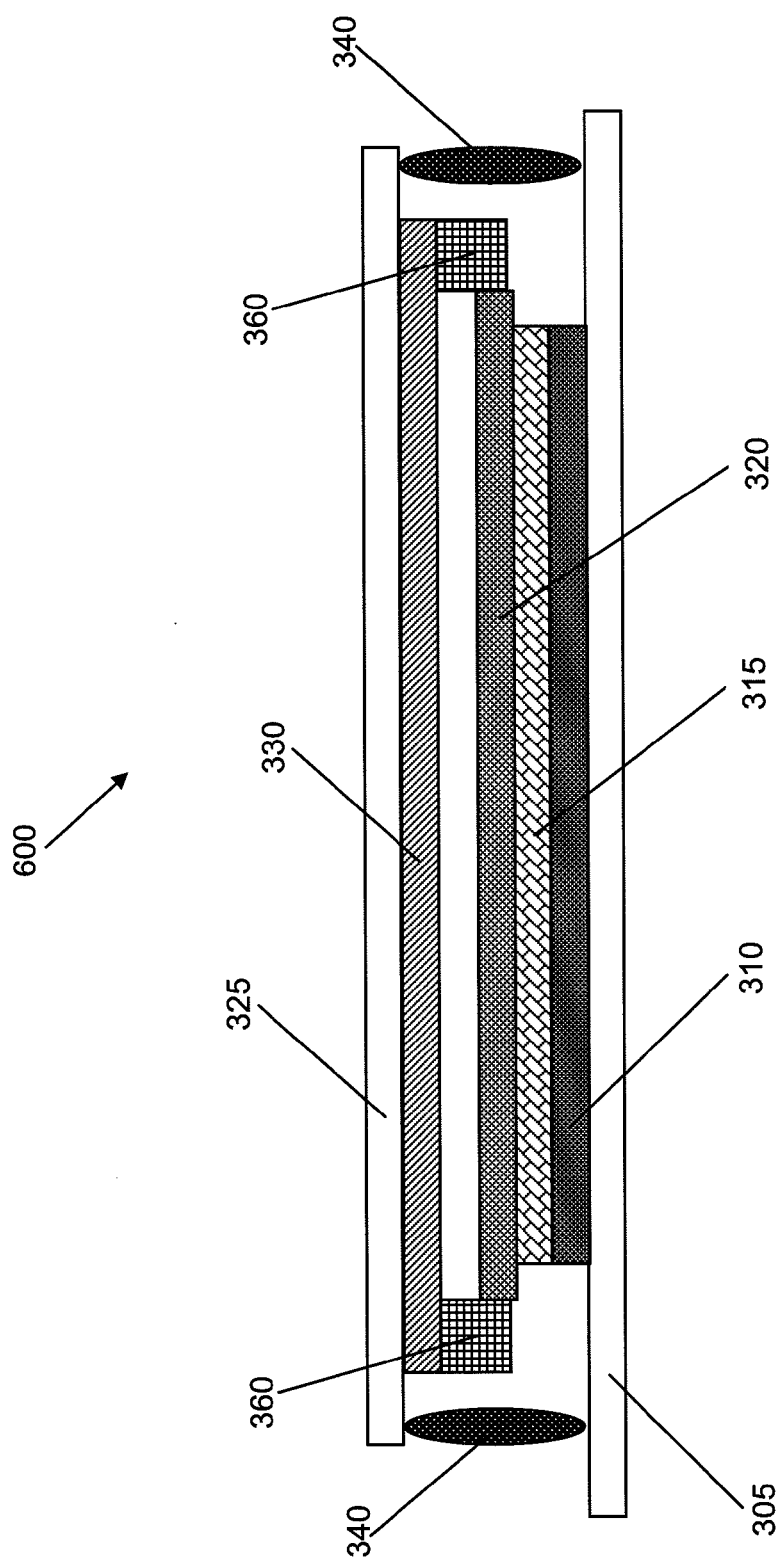
FIG. 6 shows fourth embodiment of an OLED with a conducting cover.

FIG. 6 shows an OLED embodiment 600 in which electrically conductive cover 330 is connected to second electrode 320 by electrically conductive material 360. In this embodiment, electrically conductive cover 330 may enhance emission uniformity by increasing the effective electrical conductivity of second electrode 320.

In an alternative to the embodiment shown in FIG. 6 a conductive adhesive (not shown) may be disposed between second electrode 320 and cover 330 in place of, or in addition to, electrically conductive material 360. Depending on the conductivity of this adhesive, a conducting cover may not be necessary in this alternative.

Figure 7A:
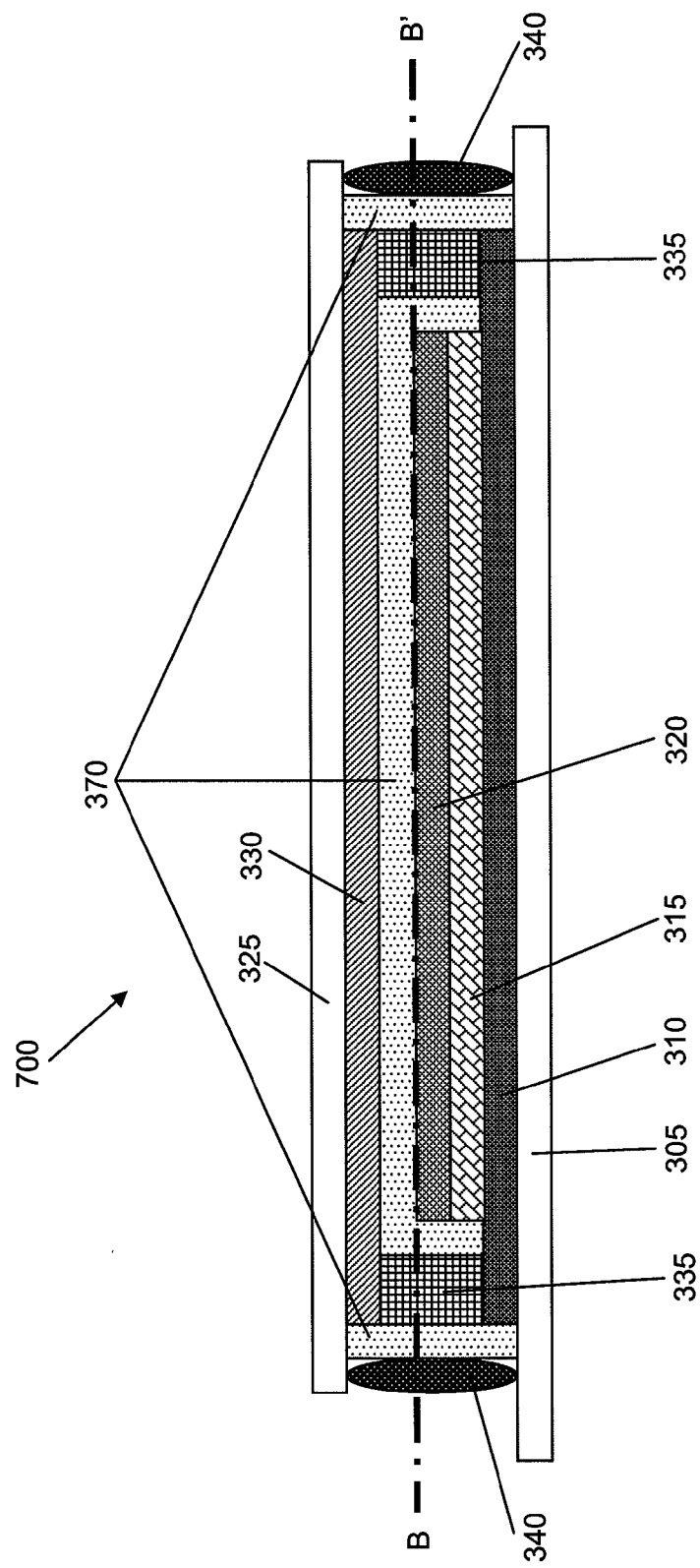
Figure 8:
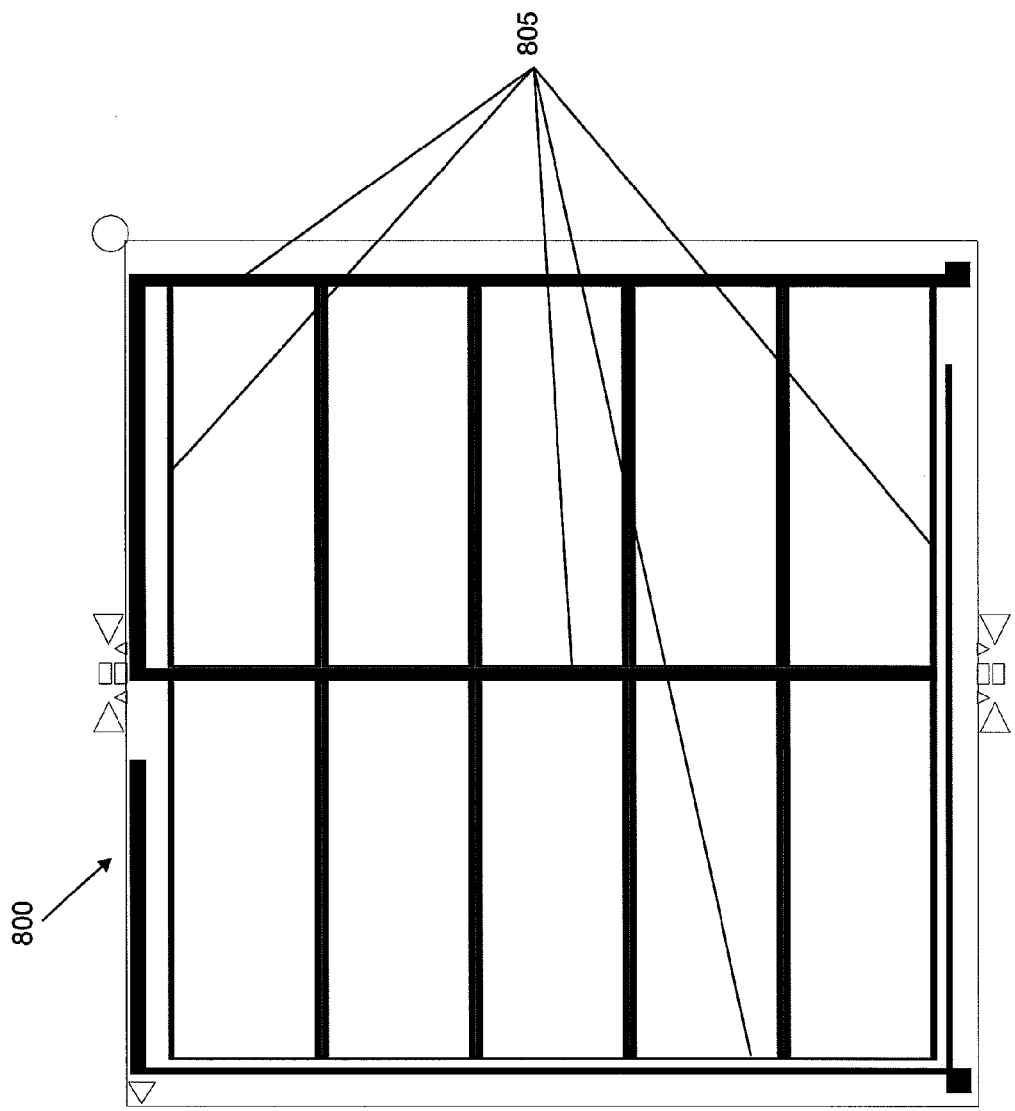
FIG. 8 shows an OLED with buss lines.

FIGS. 7A and 7B show side view and top view, respectively, of an OLED embodiment 700 in which a heat-conductive material 370 fills a space between electrically conductive cover 330 and substrate 305. The top view of FIG. 7B is a downward view from the cut line B-B' in FIG. 7A. The presence of heat-conductive material 370 may enhance the dissipation of generated heat and thus extend the operating lifetime of OLED 700. Heat-conductive material 370 may be a solid or a liquid.

OLED embodiments 300, 400, 500, 600, and 700, shown in FIGS. 3, 4, 5, 6, and 7, respectively, may be configured as bottom-emitting, top-emitting, or emitting from both top and bottom. The latter configuration may be referred to as a transparent OLED. One or both of electrodes 310 or 320 may be transparent. One or both of electrodes 310 or 320 may be fabricated using a transparent conducting oxide such as indium tin oxide (ITO). One or both of cover 325 and substrate 305 may be a transparent material, such as glass. Electrically conductive cover 330 may be transparent. An example of a transparent electrically conductive cover 330 is a metallic film sufficiently thin to be essentially transparent while still thick enough to be sufficiently electrically conductive. Electrically conductive cover 330 can be optimized for conductivity and transparency more effectively than can an electrode, since electrically conductive cover 330 can be optimized separately in a manner that is not limited by compatibility with organic material in light-emitting structure 315. As an example, a thickness of electrically conductive cover 330 may be adjusted for an optimal combination of conductivity and transparency, since conductivity tends to increase with thickness and transparency tends to decrease with thickness. Optimal thickness will depend on the specific material or material combination used in electrically conductive cover 330.

One of electrodes 310 or 320 may be configured as an anode for light-emitting structure 315 with the other configured as a cathode for light-emitting structure 315.

Electrically conductive cover 330 does not function as a microcavity, either by itself or in combination with other structures of any OLED. A microcavity is an optically resonant structure designed to increase the external emission intensity of a light emitting device. Because of its resonant nature, a microcavity may significantly alter the spectrum of the light emitted by the device. A light-emitting device employing a microcavity is described in U.S. Published Patent Application No. US-2008/0067921.

As a specific example, the OLED 300 of FIG. 3 may be a bottom-emitting OLED in which substrate 305 is transparent, electrode 310 is an anode fabricated using a transparent electrical conductor, and second electrode 320 is a cathode.

Measurements were performed on OLEDs with and without a conducting cover similar to that described above, but otherwise identical in structure and size. The conducting cover was electrically connected to an anode. Those OLEDs with a conducting cover were found to have higher emission uniformity and were brighter at lower driving currents compared to those without a conducting cover. The OLEDs with a conducting cover were also found to have lower overall resistance (that is, higher overall conductivity).

OLEDs fabricated in accordance with the above embodiments may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control OLEDs fabricated in accordance with the above embodiments, including passive matrix and active matrix. Many of the devices are intended for use in a temperature range comfortable to humans, such as 18° C. to 30° C., and, in particular, at room temperature (20-25° C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

It is understood that the various embodiments described herein are by way of example only, and are not intended to limit the scope of invention. For example, many of the materials and structures described herein may be substituted with other materials and structures without deviating from the spirit of the embodiments. The embodiments as claimed may therefore include variations from the particular examples and preferred embodiments described herein, as will be apparent to one of skill in the art. It is understood that various theories as to why various embodiments work are not intended to be limiting.

What is claimed is:

1. An organic light emitting device (OLED) configured to emit light uniformly over an emitting area, the OLED comprising:
    a substrate;
    an electrode disposed over the substrate;
    a light-emitting structure comprising an organic material, the light-emitting structure in contact with the electrode;
    an electrically conductive cover disposed over the electrode; and
    an electrically conductive connecting material disposed between the electrically conductive cover and the electrode and providing an electrically conductive path connecting the electrically conductive cover and the electrode.

2. The OLED of claim 1, wherein the electrode is configured as one of an anode or a cathode for the light emitting structure.

3. The OLED of claim 1, wherein, the electrode is essentially transparent to the emitted light.

4. The device of claim 1, wherein the electrically conductive cover is essentially transparent to the emitted light.

5. The device of claim 1, wherein the electrically conductive connecting material comprises at least one of a conductive adhesive, a conductive elastomer, a conductive polymer, a conductive epoxy, or a mechanical connector.

6. The device of claim 5, wherein the mechanical connector comprises at least one of an electrically conducting wire or an electrically conducting spring.

7. The device of claim 1 further comprising a heat-conductive material filling a space between the electrically conductive cover and the substrate.

8. The device of claim 7, wherein the heat-conductive material comprises at least one of a solid or a liquid.

9. A method for fabricating an organic light-emitting device (OLED) with uniform light emission over an emitting area, comprising:
    disposing an electrode on a substrate;
    fabricating a light emitting structure comprising an organic material, the light emitting structure in contact with the electrode;
    placing an electrically conductive connection material in contact with the electrode; and
    disposing an electrically conductive cover over the electrode and in contact with the electrically conductive connection material, forming an electrically conductive path that includes the cover, the electrically conductive connection material, and the electrode.

10. The method of claim 9, wherein the electrode is configured as one of an anode or a cathode for the light emitting structure.

11. The method of claim 9, wherein the disposing of an electrode comprises disposing an electrode essentially transparent to the emitted light.

12. The method of claim 9, wherein the fabricating of an electrically conductive cover comprises fabricating a cover essentially transparent to the emitted light.

13. The method of claim 9, wherein the electrically conductive connection material comprises at least one of a conductive adhesive, a conductive elastomer, a conductive polymer, a conductive epoxy, or a mechanical connector.

14. The method of claim 13, wherein the mechanical connector comprises at least one of an electrically conducting wire or an electrically conducting spring.

15. The method of claim 9, further comprising disposing a heat conductive material within a space between the electrically conductive cover and the substrate.

16. The method of claim 15, wherein the heat-conductive material comprises at least one of a solid or a liquid.

17. The device of claim 1, wherein the electrically conductive cover is attached to the OLED by adhesive.

18. The organic light emitting device of claim 1, wherein the light emitting structure is disposed between the substrate and the electrically conductive cover.

* * * * *